(12) United States Patent
Colombo et al.

(10) Patent No.: US 7,071,519 B2
(45) Date of Patent: Jul. 4, 2006

(54) CONTROL OF HIGH-K GATE DIELECTRIC FILM COMPOSITION PROFILE FOR PROPERTY OPTIMIZATION

(75) Inventors: Luigi Colombo, Dallas, TX (US); Mark Visokay, Richardson, TX (US); James Joseph Chambers, Dallas, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/338,310

(22) Filed: Jan. 8, 2003

(65) Prior Publication Data

US 2004/0129969 A1 Jul. 8, 2004

(51) Int. Cl.
*H01L 29/94* (2006.01)

(52) U.S. Cl. .................. 257/411; 257/406; 257/410

(58) Field of Classification Search ............. 257/411, 257/406, 410
See application file for complete search history.

(56) References Cited

U.S. PATENT DOCUMENTS

| | | | |
|---|---|---|---|
| 5,443,992 A * | 8/1995 | Risch et al. | 438/270 |
| 6,358,867 B1 * | 3/2002 | Tews et al. | 438/771 |
| 6,445,015 B1 * | 9/2002 | Braddock | 257/192 |
| 6,521,912 B1 * | 2/2003 | Sakama et al. | 257/57 |
| 6,576,967 B1 * | 6/2003 | Schaeffer et al. | 257/411 |
| 2001/0024387 A1 | 9/2001 | Raaijmakers et al. | |
| 2002/0030222 A1 | 3/2002 | Agarwal | |
| 2002/0089023 A1 * | 7/2002 | Yu et al. | 257/411 |
| 2002/0093075 A1 | 7/2002 | Gates et al. | |
| 2003/0224573 A1 * | 12/2003 | Chidambarrao et al. | 438/258 |
| 2004/0038554 A1 * | 2/2004 | Ahn et al. | 438/778 |
| 2004/0056301 A1 * | 3/2004 | Ahmed et al. | 257/327 |

* cited by examiner

*Primary Examiner*—Tu-Tu Ho
(74) *Attorney, Agent, or Firm*—Jacqueline J. Garner; Wade James Brady, III; Frederick J. Telecky, Jr.

(57) ABSTRACT

Methods and systems are disclosed that facilitate formation of dielectric layers having a particular composition profile by forming the dielectric layer as a number of sub-layers. The sub-layers are thin enough so that specific relative compositions can be achieved for each layer and, therefore, the sub-layers collectively yield a dielectric layer with a particular profile. The formation of individual sub layers is accomplished by controlling one or more processing parameters for a chemical vapor deposition process that affect relative compositions. Some processing parameters that can be employed include wafer temperature, pressure, and precursor flow rate.

5 Claims, 9 Drawing Sheets

CONTROL OF HIGH-K GATE DIELECTRIC FILM COMPOSITION PROFILE FOR PROPERTY OPTIMIZATION

FIELD OF THE INVENTION

The present invention relates generally to the field of semiconductor fabrication, and more particularly, relates to systems and methods that facilitate control of and fabrication of high-k gate dielectric films.

BACKGROUND OF THE INVENTION

Semiconductor devices continue to be reduced in dimensions while maintaining or increasing in performance in response to an ever-increasing demand. This increasing demand is likely to continue and requires improvements in semiconductor fabrication processes and structures. Improvements in semiconductor processes permit fabrication of semiconductor devices in smaller dimensions and in higher density, quantity, and reliability. Improvements in semiconductor structures typically yield greater circuit performance, power control, and reliability.

Semiconductor devices are comprised of a number of materials, components, structures, and layers. One type of layer employed in semiconductor devices is a dielectric layer, which is comprised of dielectric material. Dielectric materials, also referred to as dielectrics, exhibit a large attractive force between the nucleus and orbiting electrons and have a net effect of a large amount of resistance to the movement of electrons. Dielectrics have low conductivity and high resistivity in contrast to conductive materials that have a high conductivity and low resistivity. Additionally, dielectrics can be divided into low-k dielectrics, which have a relatively low capacitance for a given thickness and high-k dielectrics, which have a relatively high capacitance for a given thickness. The "k" refers to the dielectric constant of particular dielectric materials. Dielectrics, particularly high-k dielectrics, are often utilized in capacitor and capacitor like structures in semiconductor devices. Such structures are formed whenever a dielectric layer is formed between two conductors. For example, capacitor structures are formed in MOS gate structures by forming a dielectric layer between metal or polysilicon layers and silicon substrates.

The properties of high-k dielectric layers or films are sensitive to the relative compositions of the materials comprising the dielectric layers or films. These properties can become even more sensitive as dielectric layers and/or films continue to shrink in thickness. Particularly problematic is the lack of control of relative compositions of materials at different locations within the depth of the dielectric layer or film. Thus, processes and systems that facilitate control of relative compositions throughout various depths of dielectric layers are desirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates control of relative compositions of dielectric layers throughout their depths. Thus, the present invention permits greater control of dielectric properties as a result of the control of relative compositions of the dielectric layers, which further facilitates improvements in semiconductor device operation and fabrication.

The present invention controls formation of a particular relative composition profile by forming a high-k dielectric layer as a number of sub-layers. The sub-layers are thin enough so that specific relative compositions can be achieved for each layer and, therefore, the sub-layers collectively yield a dielectric layer with a particular composition profile. The formation of individual sub layers is accomplished by controlling one or more processing parameters for a chemical vapor deposition process that affect relative compositions. Some processing parameters that can be employed include wafer temperature, pressure, and precursor flow rate.

Additionally, the present invention can facilitate bonding with oxide, polysilicon, and metal layers by adjusting relative compositions at interfaces so as to improve bonding and thereby reducing interfacial defect density. For example, a relative composition of a sub-layer can be increased with respect to silicon to facilitate bonding with an adjacent silicon layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates semiconductor device fabrication by forming dielectric layers having particular relative composition profiles. Dielectric layers are one component of semiconductor devices such as metal oxide semiconductor (MOS) device transistors. Traditionally, silicon dioxide ($SiO_2$) has been employed as the dielectric material for such dielectric layers. However, the dielectric constant for silicon dioxide requires that the dielectric be aggressively scaled to a minimum thickness, which can result in leakage current and tunneling and therefore hampers further size reductions in semiconductor devices. But, dielectric compounds that have a higher dielectric constant (e.g., high-k dielectric) can be utilized in place of silicon dioxide and thereby permit semiconductor device dimensions to be reduced.

A challenge to formation of dielectric layers with dielectric compounds is controlling the relative composition ratios throughout the depths of the dielectric layer. As such, the present invention facilitates control of relative compositions of dielectric layers throughout their depths by forming the dielectric layer as a series of discrete or continuous sub-layers. The individual sub-layers are thin enough to permit adequate control of the relative compositions. As a result, the present invention permits greater control of dielectric properties, which further facilitates improvements in semiconductor device operation and fabrication.

The present invention controls formation of a particular relative composition profile by forming a high-k dielectric layer as a number of sub-layers. The sub-layers are thin enough so that specific relative compositions can be achieved for each layer and, therefore, the sub-layers collectively yield a dielectric layer with a particular composition profile. The formation of individual sub layers is accomplished by controlling one or more processing parameters for a chemical vapor deposition process that affect relative compositions. Some processing parameters that can be employed include wafer temperature, pressure, and precursor flow rate.

Figure 1:
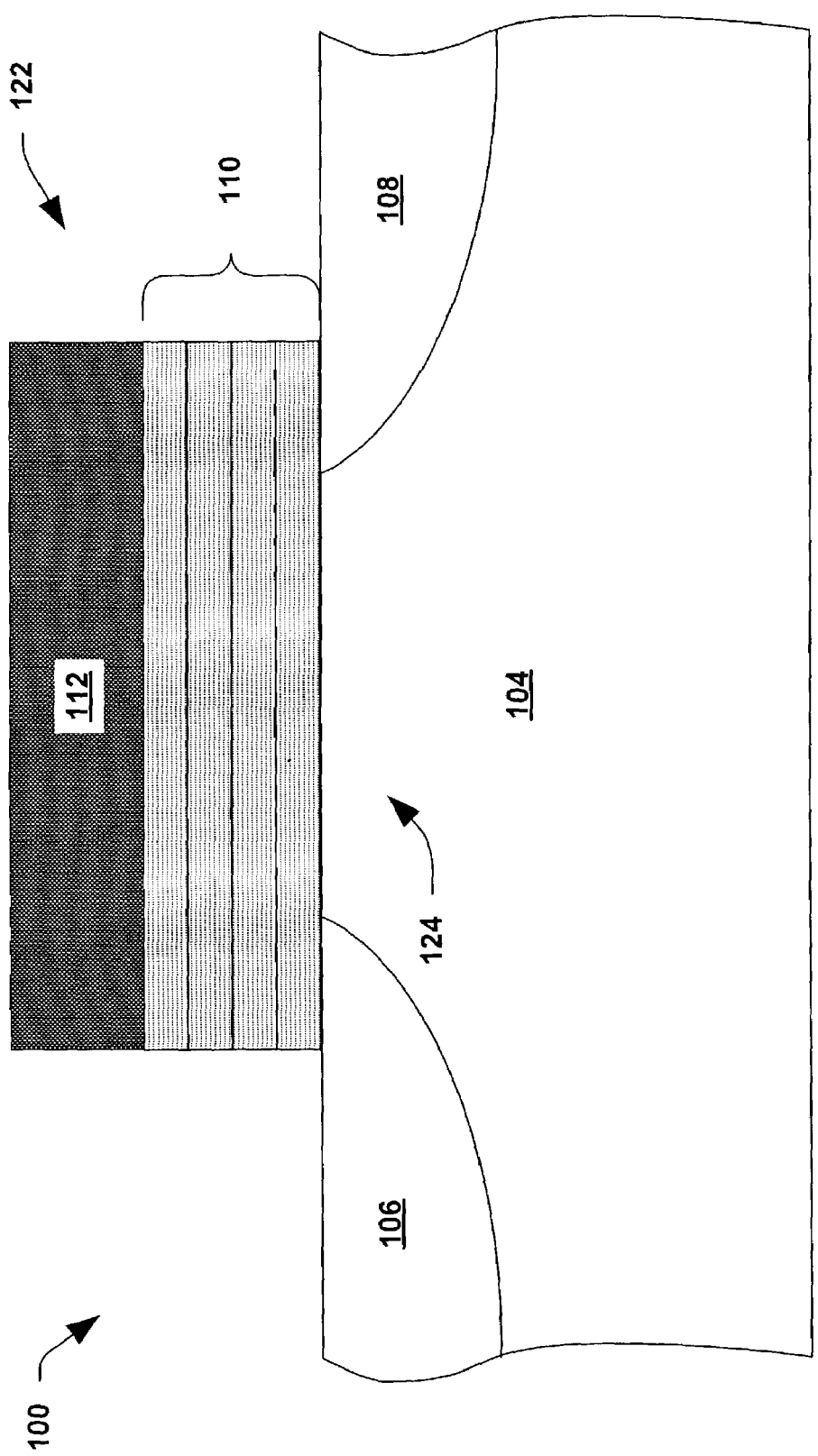
FIG. 1 is a cross sectional view of a semiconductor device in accordance with an aspect of the present invention.

Beginning with FIG. 1, a cross sectional view of a semiconductor device 100 in accordance with an aspect of the present invention is depicted. The device 100 includes a drain region 106, a source region 108, a channel region 124, a dielectric layer 110, and a gate electrode 112. The dielectric layer 110 has a particular profile of relative composition of components comprising the layer. Therefore, the dielectric layer 110 has specific, controlled properties as a result of the particular profile.

The dielectric layer 110 is formed on a semiconductor body 104 such as a semiconductor substrate, epitaxial layer or the like. The semiconductor layer 104 can be doped so as to have n-type or p-type conductivity. A gate electrode 112, comprised of a conductive material such as metal, polysilicon, silicon-germanium, or the like, is formed on the dielectric layer 110. The source region 106 and the drain region 108 are formed within the semiconductor layer 104, for example, after patterning the dielectric layer and the gate 104, therein defining a gate stack 122. A channel region 124 is defined between the source region 106 and the drain region 108.

The dielectric layer 110 is comprised of a high-k dielectric material, is a composite of a number of sub-layers, and has a particular composition profile. The sub-layers, and therefore the dielectric layer 110, are comprised of a dielectric compound represented by the formula, $M1_xM2_{1-x}O_zN_w$, where M1 and M2 are chosen from the list of elements comprising Hf, Zr, La, Gd, Pr, Ce, Si, Al, Y, and the like. The O and N component ratios can be adjusted as desired for a given implementation. The dielectric compound has an overall dielectric constant at or between dielectric constants of the $M1O_{z'}N_{w'}$, and $M2O_{z''}N_{w''}$ materials. Such dielectric compounds can yield dielectric layers with a higher dielectric constant than $SiO_2$. Additionally, high-k dielectric compounds also reduce leakage current by providing a greater physical thickness than $SiO_2$ for a desired electrical oxide thickness (EOT).

The individual sub-layers are formed via a chemical vapor deposition process with a first precursor and a second precursor. The first precursor yields at least M1 and the second precursor yields at least M2. The chemical vapor deposition process involves placing a wafer containing the device 100 into a chamber and flowing the first precursor and the second precursor into the chamber at respective flow rates. The precursors are introduced into the chamber and mixed, forming a vapor containing desired atoms and/or molecules, which are components of the dielectric compound. The desired atoms and/or molecules from the vapor deposit on the wafer surface, and thereby the semiconductor layer 104 surface, over a period of time thereby, forming a sub-layer of the dielectric layer 110. The relative amounts of M1 and M2 in the dielectric layer, defined by "X", of the dielectric compound is a function of process parameters for the chemical vapor deposition including, but not limited to, precursor flow rate, chamber/wafer temperature, chamber pressure, and the like. Some exemplary thicknesses for the sub-layers are about 2 monolayers or less, about 6–8 Angstroms, or preferably about 3–5 Angstroms. An exemplary thickness for the dielectric layer 110 is about 10 to 100 Angstroms or, more preferably, about 15 to 30 Angstroms. In contrast, a silicon dioxide layer is generally required to be more than 25 Angstroms in order to avoid appreciable leakage currents. It is appreciated that other suitable thicknesses for the sub-layers and the dielectric layer are contemplated by the present invention.

As an example, for a dielectric compound wherein M1 is Hf and M2 is Si, the relative amount of Si can be increased by increasing temperature, increasing pressure, and/or increasing the flow rate of the second precursor, which contains Si. Consequently, increasing temperature, increasing pressure or increasing the flow rate of the second precursor has the result of decreasing "X".

As a result of controlling the process parameters for the chemical vapor deposition process, the relative ratio can be adjusted for each sub-layer and, additionally, within each sub-layer. Thus, the dielectric properties, such as dielectric constant, can be adjusted to constant levels for a particular sub-layer or can be adjusted in situ to yield a varying profile (e.g., linear, step function, gradient, and the like) within the particular sub-layer. Thus, for example, a sub-layer can be formed having a first dielectric constant at a bottom of the sub-layer, a second dielectric constant at a top of the sub-layer, and having a substantially linear change with respect to the dielectric constant from the bottom to the top of the sub-layer.

As a consequence of controlling the relative ratio for each of the sub-layers comprising the dielectric layer 110, the particular profile of the dielectric layer 110 can be controlled. In contrast, conventional techniques merely yield a naturally occurring profile and cannot, for example produce a profile of a substantially constant relative ratio for a dielectric layer having a suitable thickness as does the present invention.

It is appreciated that the sub-layers of the dielectric layer 110 can be formed in discrete process steps or can, alternately, be formed in a continuous process wherein one or more process parameters are adjusted. Thus, modification of one or more processing parameters that affect the relative composition ratio can indicate processing of another or new sub-layer.

Figure 2:
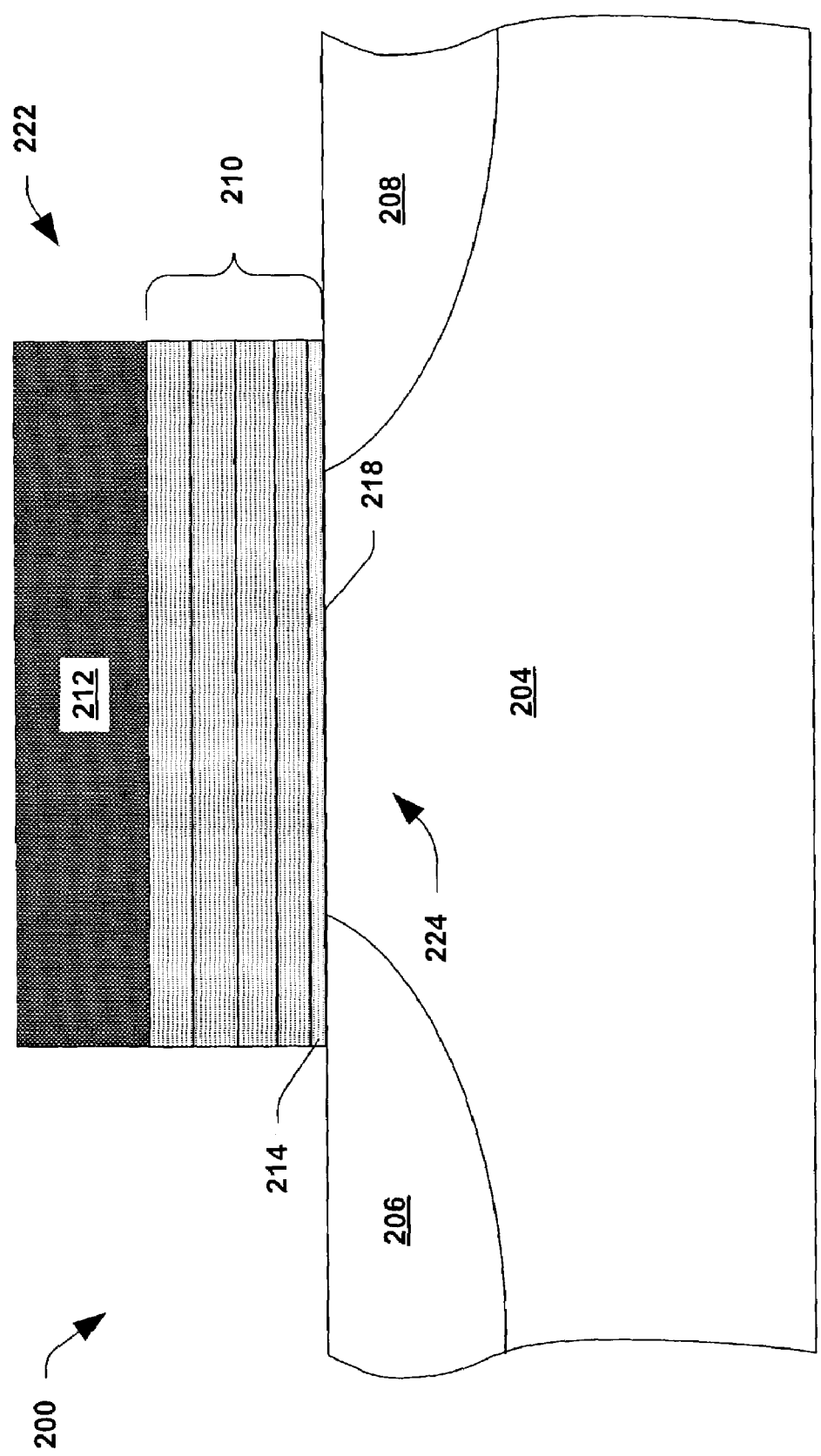
FIG. 2 is a cross sectional view of a semiconductor device in accordance with an aspect of the present invention.

FIG. 2 is a cross sectional view illustrating a semiconductor device 200 in accordance with an aspect of the present invention. The device 200 includes a drain region 206, a source region 208, a channel region 224, a dielectric layer 210, and a gate electrode 212. As with the device 100 of FIG. 1, the dielectric layer 210 has a particular profile of relative composition of components comprising the layer. Consequently, the dielectric layer 210 has specific, controlled properties as a result of the particular profile. Additionally, the dielectric layer 210 has a lower interface sub-layer 214 specifically designed to facilitate bonding with a lower semiconductor layer.

The dielectric layer 210 is formed on a semiconductor layer 204. The semiconductor layer 204 is comprised of silicon and can be doped so as to be n-type or p-type conductivity. A gate electrode 212, comprised of a conductive material such as metal or polysilicon, silicon-germanium, or the like, is formed on the dielectric layer 210. The source region 206 and the drain region 208 are formed within the semiconductor layer 204 after patterning the dielectric layer and the gate 204 therein defining a gate stack 222. A channel region 224 is defined between the source region 206 and the drain region 208. Additionally, a lower interface 218 is defined at an upper surface of the semiconductor layer 204 and a lower edge of the dielectric layer 210.

The dielectric layer 210 is comprised of a high-k dielectric material, is a composite of a number of sub-layers, and has a particular composition profile, for example, similar to the dielectric layer 110 of FIG. 1. The sub-layers, and therefore the dielectric layer 210, are comprised of a dielectric compound represented by the formula $M1_xM2_{1-x}O_zN_w$, where M1 is an element such as those in the list Hf, Zr, La, Gd, Pr, Ce, Y, Al and the like, and where M2 is Si. The O and N component ratios can be adjusted as desired for a given implementation.

The individual sub-layers are formed via a chemical vapor deposition process with a first precursor and a second precursor as described with respect to FIG. 1. The relative ratio or composition ratio, defined by "X", of the dielectric compound is a function of process parameters for the chemical vapor deposition including, but not limited to, precursor flow rate, chamber/wafer temperature, chamber pressure, and the like.

At the lower interface of the dielectric layer 210, it is helpful for the dielectric layer composition, the relative ratio, to have a larger ratio of Si at the interface with the semiconductor layer 204 comprised of Si. Such a larger ratio of Si (e.g., "X" equal to about 0) facilitates bonding with the semiconductor layer and facilitates higher channel mobility than for similar layers having a lower ratio of Si (e.g., "X" equal to about 1). Therefore, the lower interface sub-layer 214 is formed so as to have a relatively high ratio of Si (e.g., "X" equal to about 0) at the lower interface by appropriately setting one or more processing parameters including temperature, pressure, and precursor flow rates. The processing parameters employed for forming the lower interface sub-layer 214 can be adjusted so as to gradually or otherwise alter the relative ratio to a desired and/or constant level, thereby achieving a desired and/or constant dielectric constant. Additionally, this adjustment or transition can be in a linear, exponential, step function, and the like manner.

The other, remaining sub-layers of the dielectric layer 210 are formed to have desired relative composition ratios, dielectric constants, and dielectric properties as described with respect to FIG. 1. Thus, the dielectric properties of the individual sub-layers can be adjusted to constant levels for a particular sub-layer or can be adjusted in situ to yield a varying profile (e.g., linear, step function, gradient, and the like) within the particular sub-layer.

The lower interface sub-layer 214 is a relatively small portion (e.g., about 1 or 2 monolayers) of the dielectric layer 210. Thus, the dielectric properties such as capacitance, resistivity, conductance, and the like are substantially a function of the remaining sub-layers.

Figure 3:
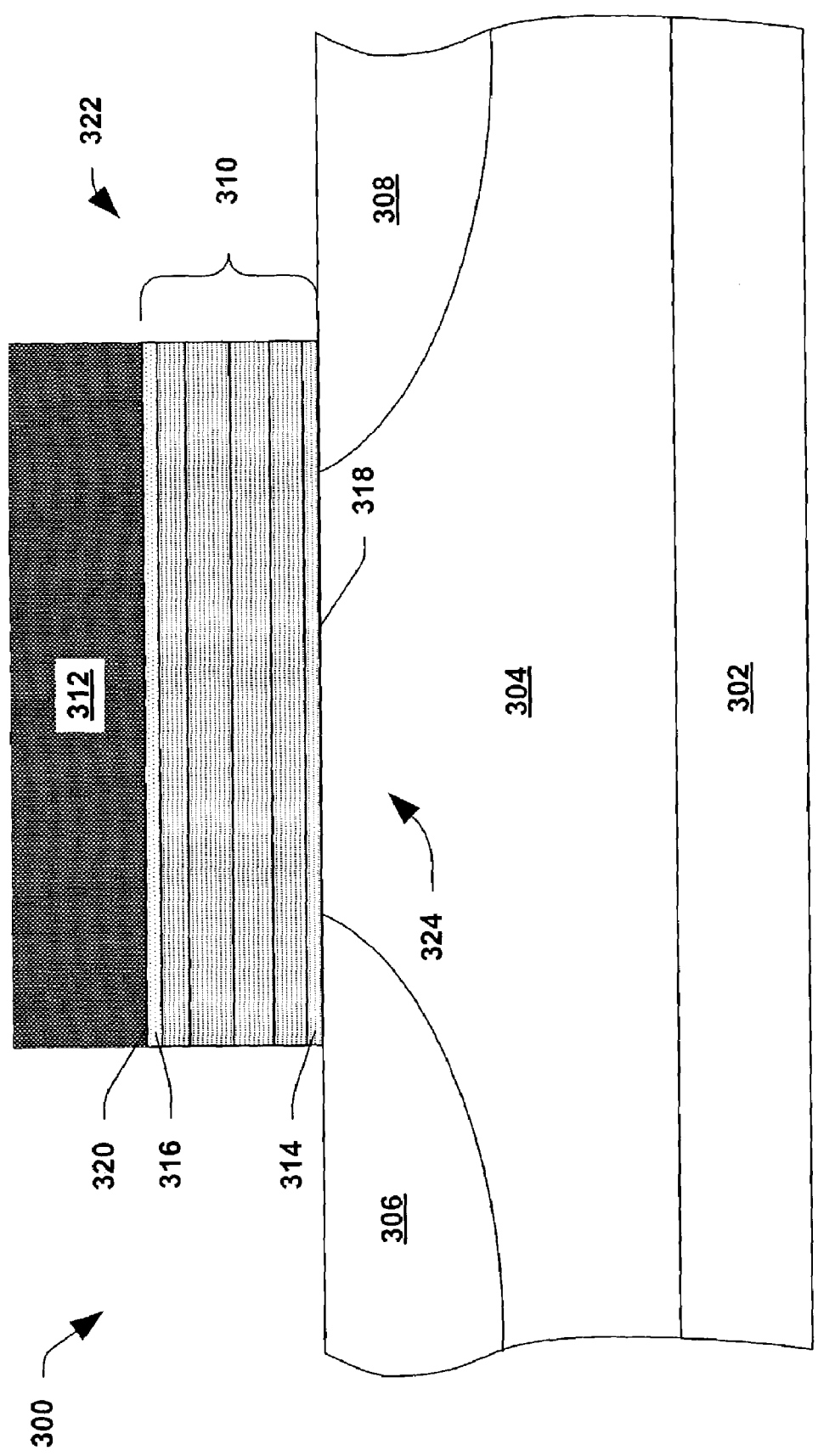
FIG. 3 is a cross sectional view of a semiconductor device in accordance with an aspect of the present invention.

FIG. 3 is a cross sectional view illustrating a semiconductor device 300 in accordance with an aspect of the present invention. The semiconductor device 300 is similar to that of the device 100 of FIG. 1. However, the dielectric layer 310 has a lower interface sub-layer 314 and an upper interface sub-layer 316 that facilitate bonding and carrier mobility.

The dielectric layer 310 is formed on a semiconductor layer 304. The semiconductor layer 304 is comprised of silicon and can be doped so as to be n-type or p-type conductivity. A gate electrode 312 is formed on the dielectric layer 310, wherein the gate electrode 312 is comprised of a conductive material such as metal or polysilicon, silicon-germanium, or the like. The dielectric layer 310 and the gate electrode 312 are patterned to define a gate stack 322. Then, a source region 306 and a drain region 308 are formed within the semiconductor layer 304 via a doping or implanting process of an appropriate dopant thereby forming regions having appropriate dopant concentrations and conductivity types. A channel region 324 is defined between the source region 306 and the drain region 308. Additionally, a lower interface 318 is defined at an upper surface of the semiconductor layer 304 and a lower edge of the dielectric layer 310 and an upper interface 320 is defined at an upper edge of the dielectric layer 310 and a lower edge of the gate electrode 312.

The dielectric layer 310 is comprised of a high-k dielectric material, is a composite of a number of sub-layers, and has a particular composition profile, similar to the dielectric layer 110 of FIG. 1. The sub-layers, and therefore the dielectric layer 310, are comprised of a dielectric compound represented by the formula, $M1_xM2_{1-x}O_zN_w$, where M1 is a an element such as those in the list Hf, Zr, La, Gd, Pr, Ce, Y, Al, and the like, and where M2 is Si. The O and N component ratios can be adjusted as desired for a given implementation.

The individual sub-layers are formed via a chemical vapor deposition process with a first precursor and a second precursor as described with respect to FIG. 1. The relative ratio or composition ratio, defined by "X", of the dielectric compound is a function of process parameters for the chemical vapor deposition including, but not limited to, precursor flow rate, chamber/wafer temperature, chamber pressure, and the like.

At the lower interface of the dielectric layer 310, it is helpful for the dielectric layer composition, the relative ratio, to have a larger ratio of Si at the interface with the semiconductor layer 304 comprised of Si. Such a larger ratio of Si (e.g., x equal to about 0) facilitates bonding with the semiconductor layer and facilitates higher channel mobility than for similar layers having a lower ratio of Si (e.g., x equal to about 1). Therefore, the lower interface sub-layer 314 is formed so as to have a relatively high ratio of Si (e.g., "X" equal to about 0) at the lower interface by appropriately setting one or more processing parameters including temperature, pressure, and precursor flow rates. The processing parameters employed for forming the lower interface sub-layer 314 can be adjusted so as to gradually or otherwise alter the relative ratio to a desired and/or constant level, thereby achieving a desired and/or constant dielectric constant. Additionally, this adjustment or transition can be in a linear, exponential, step function, and the like manner.

At the upper interface 320, it is helpful for the relative ratio of the dielectric composition near the upper interface 318 to also be adjusted to facilitate bonding and the like with the gate electrode 312. If the conductive material of the gate electrode 312 is metal, then the relative composition ratio should increase the relative amount of M1 (e.g., Hf). So doing would facilitate bonding of the dielectric layer 310 with the gate electrode 312. Alternatively, the conductive material of the gate electrode 312 is polysilicon, it is more useful for the relative composition ratio to increase the relative amount of Si near the upper interface.

As a consequence, the upper interface layer 316 is formed so as to have a relative composition ratio near the upper interface 318 that facilitates bonding of the dielectric layer 310 with the gate electrode 312. Thus, for example, an "X" value of about 1 could be obtained by adjusting the process parameters of temperature, pressure, and precursor flow rates, thereby facilitating bonding with a metal type of conductive material comprising the gate electrode 312. The processing parameters employed for forming the upper interface sub-layer 316 can be adjusted during processing so as to gradually or otherwise alter the relative ratio from a desired and/or constant level to an appropriate "X" value that facilitates bonding with the gate electrode 312, thereby achieving a desired and/or constant dielectric constant. Additionally, this adjustment or transition can be in a linear, exponential, step function, and the like manner.

The other, remaining sub-layers of the dielectric layer 310 are formed to have desired relative composition ratios, dielectric constants, and dielectric properties as described with respect to FIG. 1. Thus, the dielectric properties of the individual sub-layers can be adjusted to constant levels for a particular sub-layer or can be adjusted in situ to yield a varying profile (e.g., linear, step function, gradient, and the like) within the particular sub-layer.

The lower interface sub-layer 314 and the upper interface sub-layer 316 comprise a relatively small portion of the dielectric layer 310. As a result, the dielectric properties such as capacitance, resistivity, conductance, and the like are substantially a function of the other sub-layers.

Figure 4:
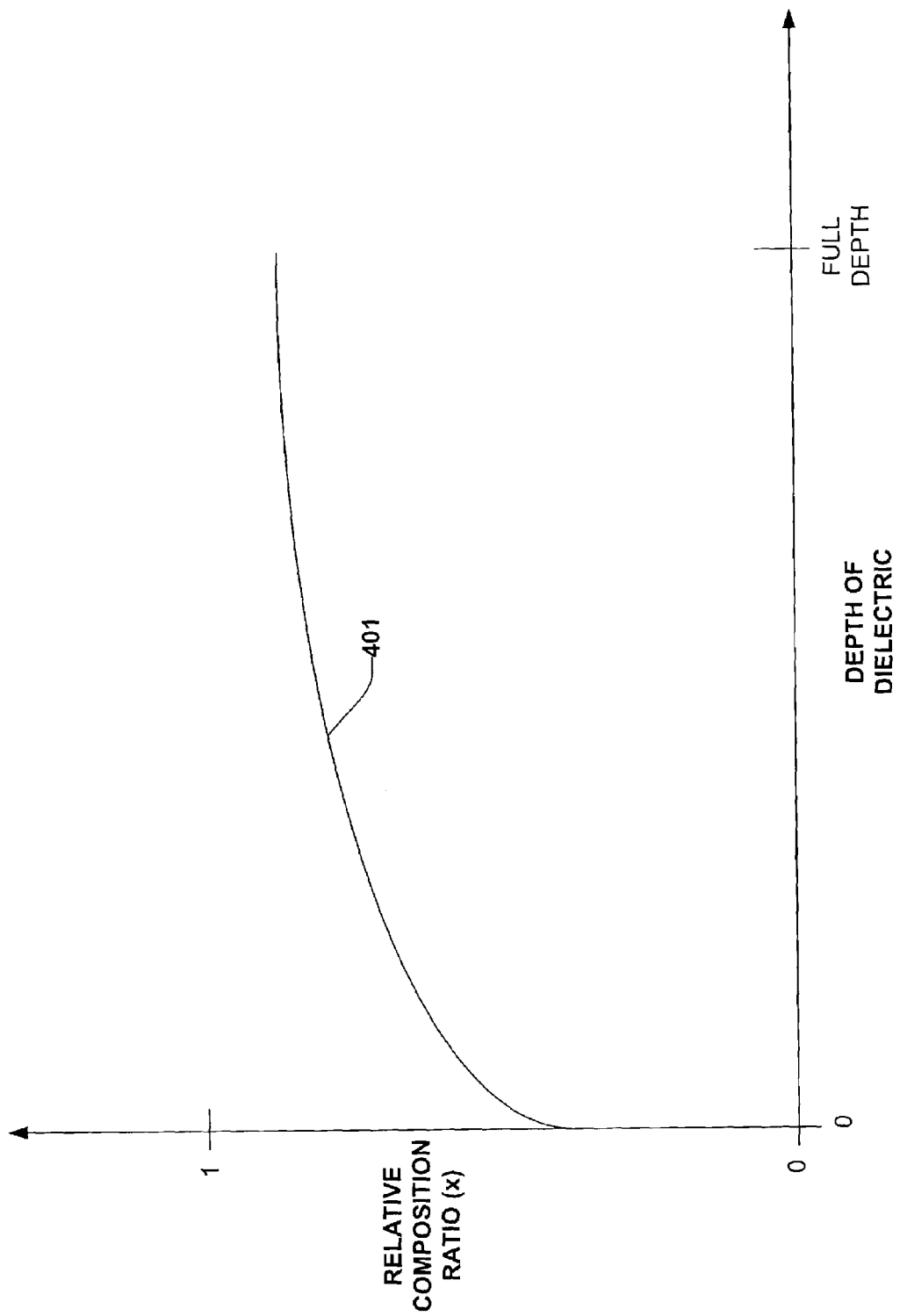
FIG. 4 is a graph illustrating an exemplary plot of relative composition ratios for a single layer dielectric layer.

Turning now to FIG. 4., a graph illustrating an exemplary plot of relative composition ratio versus depth for a single layer dielectric layer as appreciated by the inventors of the present invention is depicted. The exemplary plot is for a dielectric layer formed as a single layer, in a single process, without substantial modification of process parameters such as wafer temperature, chamber pressure, and precursor flow rates. The x-axis represents depth of the dielectric layer (starting at the substrate interface and ending at the gate electrode interface, respectively, and the y-axis represents the relative composition ratio.

The dielectric layer is comprised of a dielectric compound represented by the formula, $M1_xM2_{1-x}O_zN_w$, where M1 and M2 are elements such as those in the list Hf, Zr, La, Gd, Pr, Ce, Y, Al, Si and the like. The O and N component ratios can be adjusted as desired for a given implementation. The relative composition ratio is defined by "X" and can range from 0 to 1.

Line 401 depicts a naturally occurring composition profile for the single layer dielectric of FIG. 4. It can be seen that the ratio does vary over the depth of the dielectric layer. However, the single layer dielectric is not formed so as to specific and/or desired relative composition ratios at various depths. Such variation that occurs naturally is believed to be caused by preferential nucleation of one species over another, and/or by preferential reaction between the silicon substrate and one of the reactant species, at an initial formation over the silicon substrate. Such nucleation and/or reaction then begins to change as the layer forms, wherein the ratio "X" tends to become asymptotic to some value. In accordance with the present invention, it is appreciated that the sub-layers can be formed in discrete process steps or can, alternately, be formed in a continuous process wherein one or more process parameters are adjusted. Thus, modification of one or more processing parameters that affect the relative composition ratio can indicate processing of another sub-layer.

Figure 5:
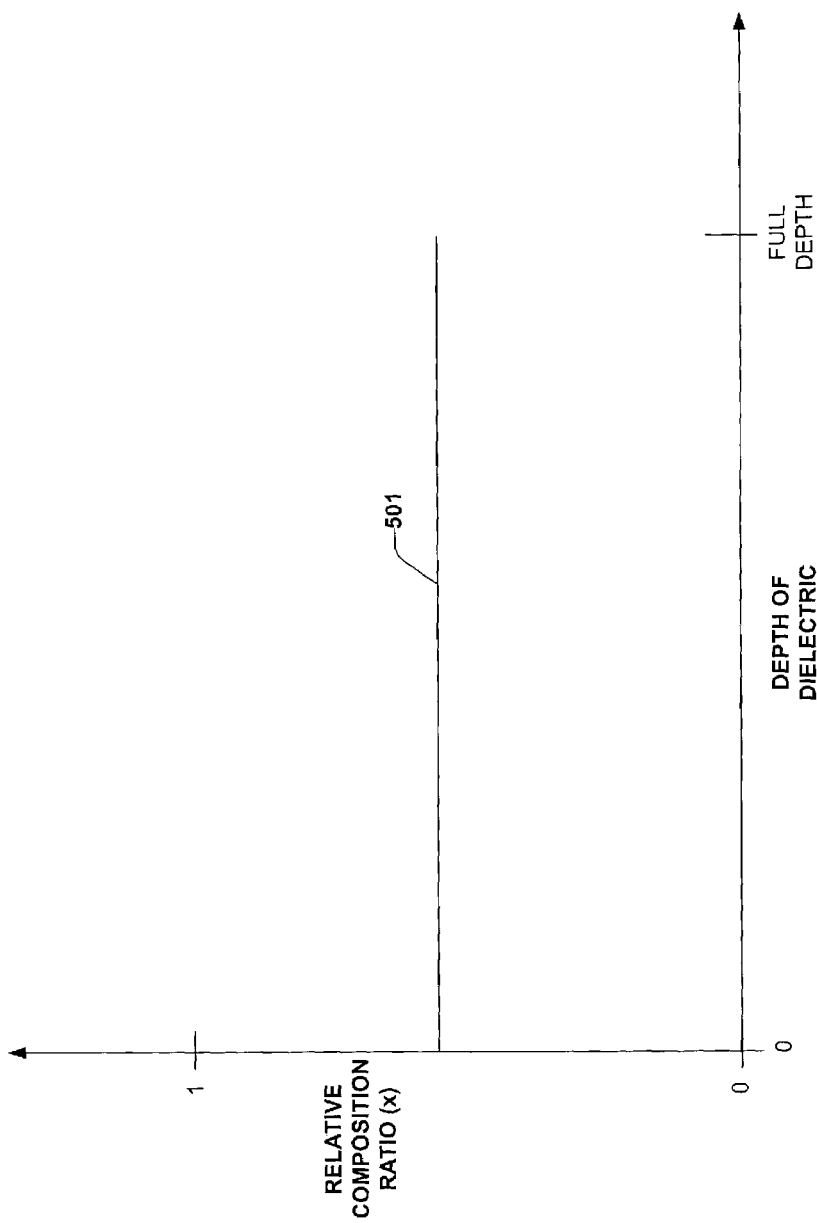
FIG. 5 is a graph illustrating an exemplary plot of relative composition ratios for a dielectric layer formed in accordance with an aspect of the present invention.

Continuing on with FIG. 5., a graph illustrating an exemplary plot of a relative composition ratio versus depth for a dielectric layer formed in accordance with an aspect of the present invention is shown. The plot is for a dielectric layer formed as a number of sub-layers so that relative composition ratios of the sub-layers can be controlled and, therefore, relative composition ratios at various depths can be controlled for the dielectric layer. The x-axis represents depth of the dielectric layer and the y-axis represents the relative composition ratio.

The dielectric layer is comprised of a dielectric compound represented by the formula, $M1_xM2_{1-x}O_zN_w$, where where M1 and M2 are chosen from the list of elements comprising Hf, Zr, La, Gd, Pr, Ce, Si, Al, Y, and the like. The O and N component ratios can be adjusted as desired for a given implementation. The relative composition ratio is defined by x and can range from 0 to 1.

Figure 6:
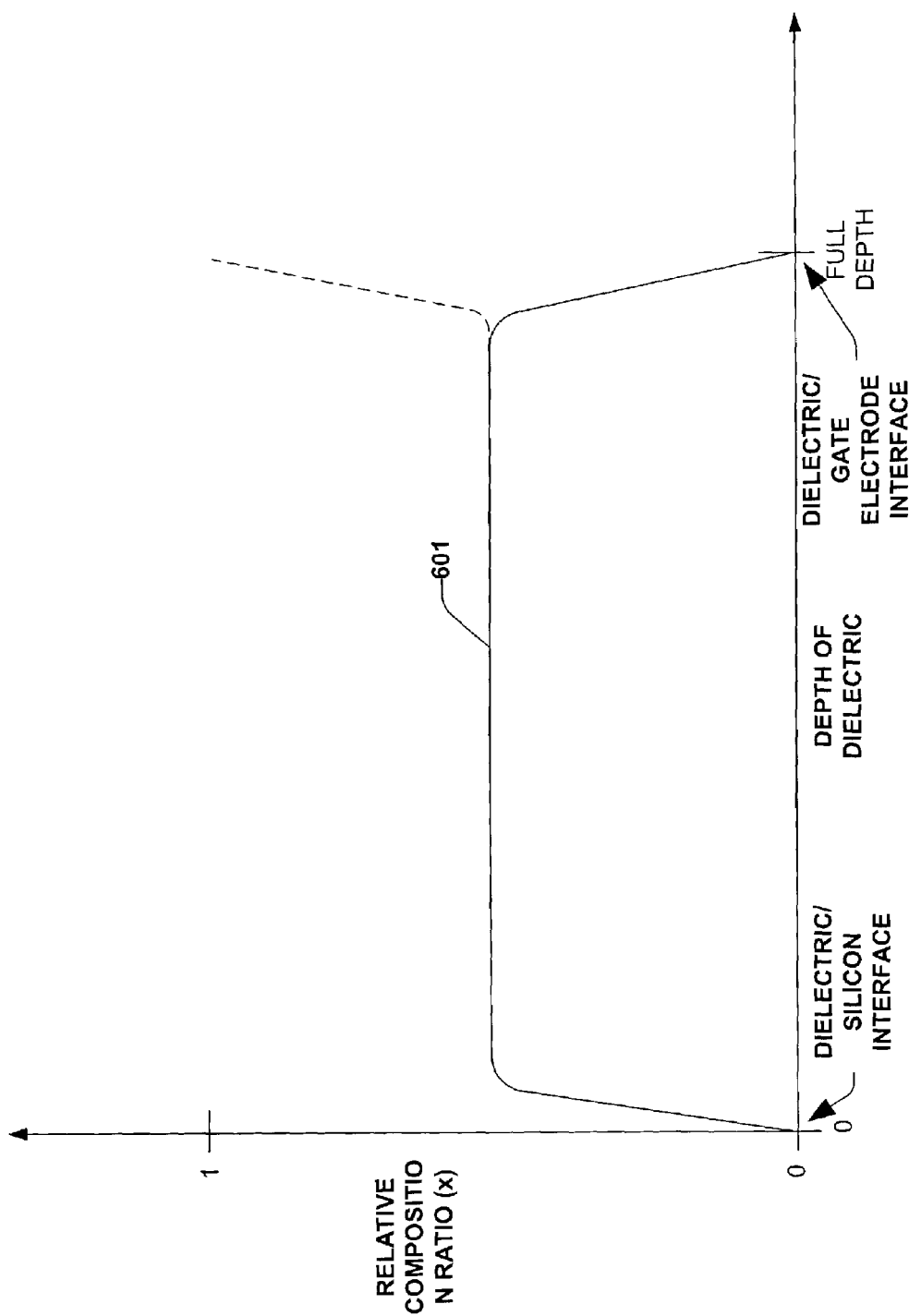
FIG. 6 is a graph illustrating an exemplary plot of relative composition ratios for a dielectric layer formed in accordance with an aspect of the present invention.

Line 501 depicts a particular composition profile for the dielectric layer of FIG. 5. Here, a generally constant composition ratio has been achieved throughout the depths of the dielectric layer, which cannot be achieved with a conventional, single layer dielectric process. The generally constant composition ratio is achieved by controlling various process parameters, such as wafer temperature, chamber pressure, and precursor flow rates during a chemical vapor deposition process that forms the dielectric layer in accordance with the present invention. As an example, an exemplary constant composition profile in accordance with an aspect of the present invention has a deviation in x of about one percent or less. FIG. 6. illustrates a graph of an exemplary plot of relative composition ratio versus depth for a dielectric layer formed in accordance with an aspect of the present invention. The plot is for a dielectric layer formed as a number of sub-layers so that relative composition ratios of the sub-layers can be controlled and, therefore, relative composition ratios at various depths can be controlled for the dielectric layer. The x-axis represents depth of the dielectric layer and the y-axis represents the relative composition ratio.

The dielectric layer is comprised of a dielectric compound represented by the formula, $M1_xM2_{1-x}O_zN_w$, where M1 and M2 are chosen from the list of elements comprising Hf, Zr, La, Gd, Pr, Ce, Si, Al, Y, and the like. The O and N component ratios can be adjusted as desired for a given implementation. The relative composition ratio is defined by "X" and can range from 0 to 1.

Line 601 depicts a particular composition profile for the dielectric layer of FIG. 6. Here, a relatively constant composition ratio has been achieved throughout most of the dielectric layer. But, at the ends of the dielectric layer the composition ratio has been adjusted so as to facilitate bonding and/or carrier mobility. Thus, where the dielectric layer with M2=silicon meets a silicon layer such as the substrate or a polysilicon gate electrode, the X value is about 0 so as to facilitate bonding with the silicon layer. As stated previously, the generally constant composition ratio is achieved by controlling various process parameters, such as wafer temperature, chamber pressure, and precursor flow rates during a chemical vapor deposition process that forms the dielectric layer in accordance with the present invention.

The following are examples of parameter settings that yield particular values of x. However, the examples are for illustrative purposes and the invention is not intended to be limited to or by the following examples. As one example, to achieve an x of about one with a constant temperature and pressure, the M1 supplying precursor flow rate should be set to about 1–100 mg per minute and the M2 supplying precursor flow rate should be set to about zero. As another example, to achieve intermediate values of x between zero and one with a constant temperature and pressure, the M1 supplying precursor flow rate should be set to be about 1–100 mg and the M2 supplying precursor flow rate should be set to be about 1–100 mg. As yet another example, to achieve an x of about 0 with a constant temperature and pressure, the M1 supplying precursor flow rate should be set to about zero and the M2 supplying precursor flow rate should be set to about 1–100 mg per minute. As another example, if the M1 and M2 supplying precursor flow rates are constant and the temperature is constant, an x of about 1 is achieved for a pressure less than about 1 Torr, an x of about zero is achieved for a pressure greater than about 10 Torr, and intermidiate values of x are obtained through the range of 1–10 Torr. As yet another example, with constant precursor flow rates and constant pressure, an x of about one is obtained at about 100–200 degrees Celsius, an intermediat value of x is obtained at about 300–600 degrees Celsius, and an x of about zero is obtained at or above 600 degrees Celsius.

Figure 7:
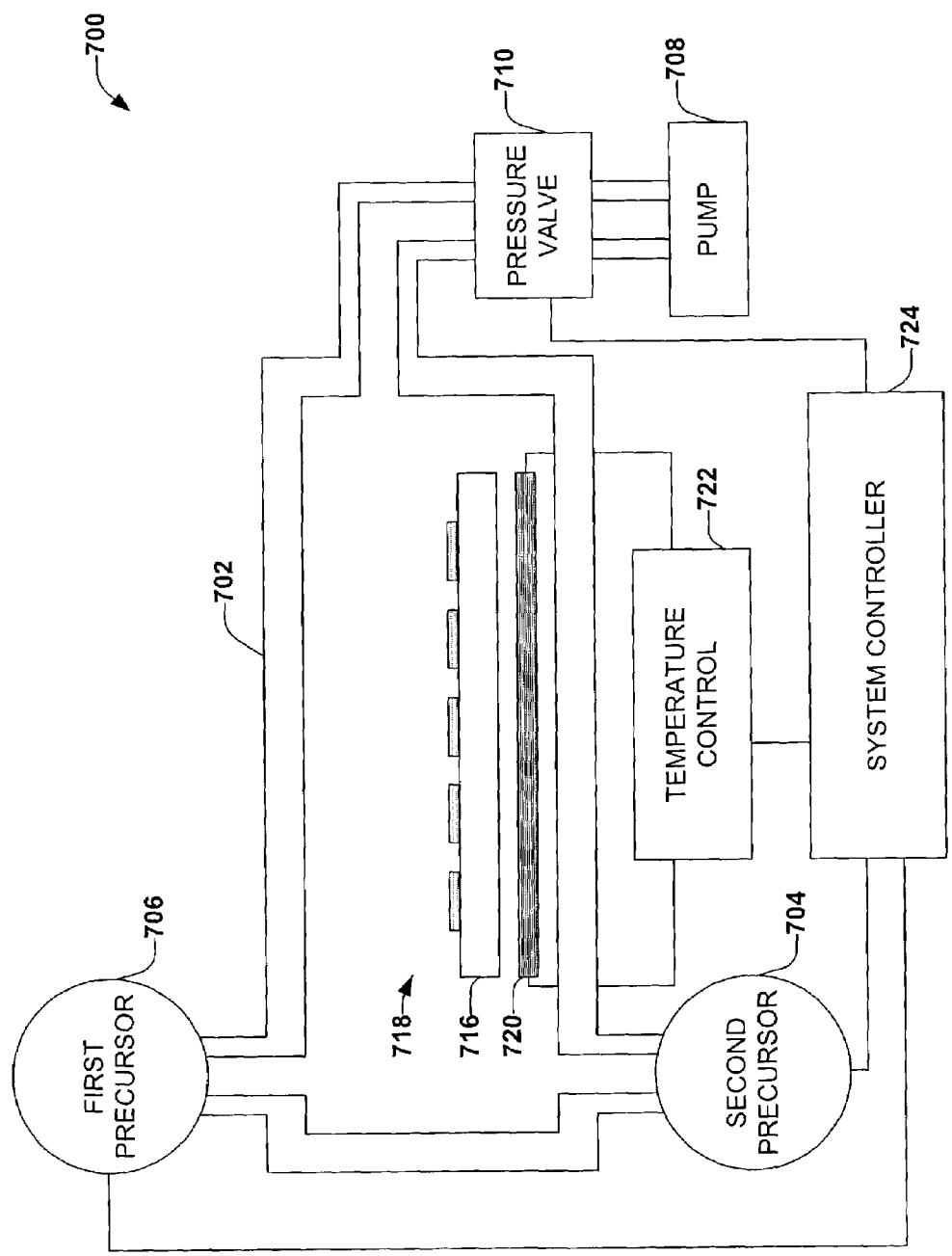
FIG. 7 is a block diagram of a control system for forming a dielectric layer having a particular profile in accordance with an aspect of the present invention.

FIG. 7 is a block diagram of a control system 700 for forming a dielectric layer having a particular profile in accordance with an aspect of the present invention. The system 700 is able to perform a chemical vapor deposition process and control/adjust process parameters during the process so as to control a relative ratio of components of a dielectric compound that comprises the dielectric layer throughout the chemical vapor deposition process. Furthermore, the system 700 can perform deposition processes wherein the relative composition of the individual constituent components of the dielectric layer, including ternary compounds, is controlled unlike other deposition methods such as atomic layer epitaxy, which have difficulty controlling relative compositions of ternary compounds. The control system 700 includes a chamber 702, a first precursor source 706, a second precursor source 704, a pump 708, a pressure value 710, a wafer boat 716, one or more wafers 718, a heating apparatus 720, a temperature control component 722, and a system controller 724. Typically, the wafer boat will not be present and wafers will be introduced into the chamber 702 manually or in an automated fashion for processing either serially or in a batch process, as may be desired.

The dielectric layer formed via the system is comprised of a high-k dielectric material, is a composite of a number of sub-layers, and has a particular composition profile. The sub-layers, and therefore the dielectric layer, are comprised of a dielectric compound represented by the formula, $M1_xM2_{1-x}O_zN_w$, where M1 and M2 are chosen from the list of elements comprising Hf, Zr, La, Gd, Pr, Ce, Si, Al, Y, and the like. The O and N component ratios can be adjusted as desired for a given implementation.

The first precursor 706 yields at least M1 and the second precursor 704 yields at least M2. The chemical vapor deposition process involves placing the one or more wafers 718 into the chamber 702 and flowing the first precursor 706 and the second precursor 704 into the chamber at respective flow rates. The precursors are introduced into the chamber, mixed and react forming a vapor containing desired atoms and/or molecules, which are components of the dielectric compound. The desired atoms and/or molecules from the vapor deposit on the wafer surface(s) over a period of time, thereby forming a sub-layer of the dielectric layer. The relative ratio, defined by "X", of the dielectric compound is a function of process parameters for the chemical vapor deposition including, but not limited to, precursor flow rate, chamber/wafer temperature, chamber pressure, and the like.

The system controller 724 controls flow rates of the first precursor 706 and the second precursor 704 and is able to appropriately adjust the flow rates throughout the chemical vapor deposition process. Additionally, the system controller 724 also communicates with the temperature control unit 722, which in turn is operative to monitor and adjust the heating apparatus to cause the chamber to be at a desired temperature. Thus, the system controller 724 is able to modify or adjust the temperature of the chamber during the chemical vapor deposition process of forming the dielectric layer. Finally, the system controller 724 also operates and adjusts the pressure value 710. For some implementations, the modification of pressure in the chamber is relatively advantageous for controlling the relative composition ratio and therefore the particular profile of the dielectric layer as compared with modification of other processing parameters. Additionally, it is appreciated that the system controller 724 can control other processing parameters and aspects of a chemical vapor deposition process. Furthermore, it is also appreciated that the system 700 is provided for illustrative purposes and can include other components and mechanisms aside from those shown.

The system 700 and variations thereof are contemplated as being in accordance with the present invention. The system 700 and variations thereof can be used to perform atmospheric chemical vapor deposition, low-pressure chemical vapor deposition, and plasma-enhanced chemical vapor deposition processes. Plasma-enhanced chemical vapor deposition is an energy enhanced deposition method in which plasma energy is added to the thermal energy.

Figure 8:
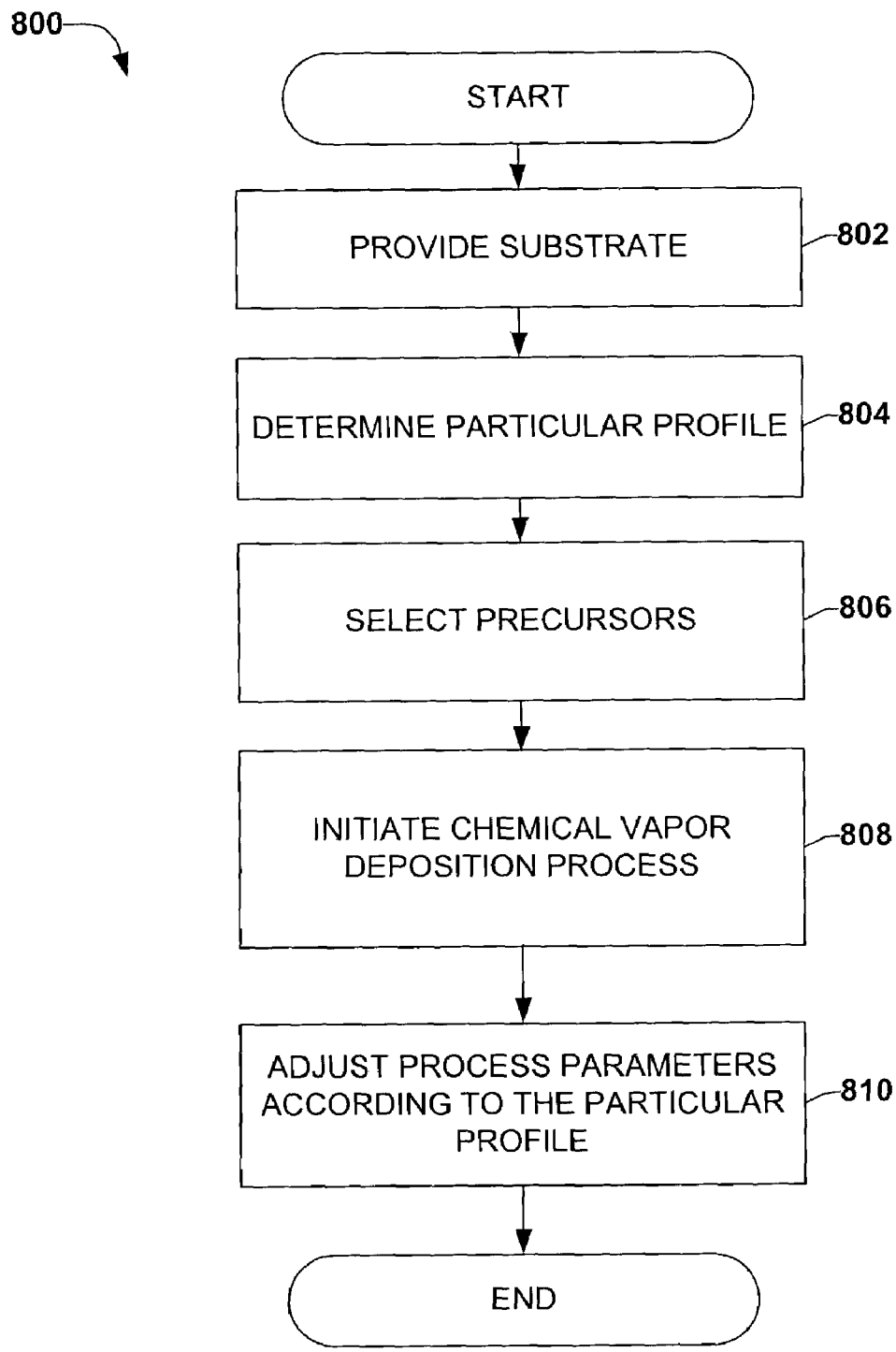
FIG. 8 is a flow diagram illustrating a method for forming a dielectric layer having a particular profile in accordance with an aspect of the present invention.
Figure 9:
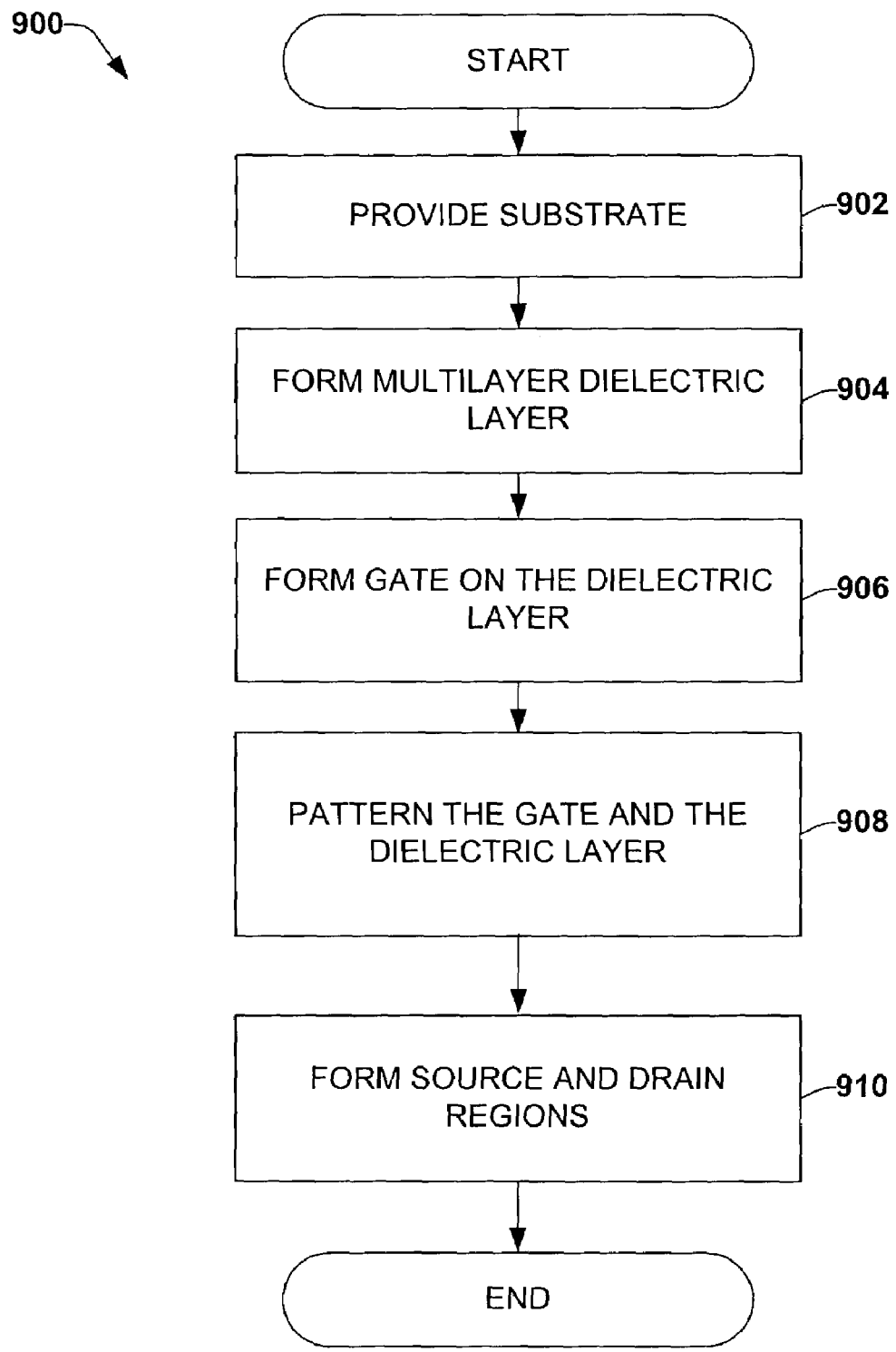
FIG. 9 is a flow diagram illustrating a method for forming a semiconductor device in accordance with an aspect of the present invention.

In view of the foregoing structural and functional features described supra, methodologies in accordance with various aspects of the present invention will be better appreciated with reference to FIGS. 8–9. While, for purposes of simplicity of explanation, the methodologies of FIGS. 8–9 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 8, a flow diagram of a method 800 for forming a dielectric layer is provided. The dielectric layer formed by the method 800 is a high-k dielectric layer that can be relatively thin or ultra-thin. The method 800 utilizes a chemical vapor deposition process and adjusts process parameters so as to control the relative composition of constituent components throughout the dielectric layer. The dielectric layer formed by the method 800 is comprised of a dielectric compound represented by the formula, $M1_xM2_{1-x}O_zN_w$, where M1 and M2 are chosen from the list of elements comprising Hf, Zr, La, Gd, Pr, Ce, Si, Al, Y, and the like. The O and N component ratios can be adjusted as desired for a given implementation.

A substrate is provided at block 802. The substrate, typically a silicon wafer, is comprised of one or more semiconductor layers and may be doped according to a specific conductivity type. A desired, particular profile is determined at block 804. The particular profile is selected so as to yield particular properties for the dielectric layer, such as capacitance, leakage current, resistivity, dielectric constant, and the like. Other characteristics, such as thickness, can also be selected. Two precursors are selected at block 806, a first precursor for M1 and a second precursor for M2, that at least partially comprise the compound dielectric materials of the dielectric layer. Additionally, initial processing parameters, including, but not limited to, wafer temperature, chamber pressure, and precursor flow rates are selected according to an initial portion of the particular profile and/or other characteristics and desired properties.

A chemical vapor deposition process is initiated at block 808 in accordance with the initial processing parameters. The chemical vapor deposition process can be an atmospheric chemical vapor deposition, a low-pressure chemical vapor deposition, a plasma-enhanced chemical vapor deposition, or a variation thereof. At various deposited thicknesses (e.g., at various times of the process), adjustments in the process parameters are performed at block 810 so as to adjust the relative composition ratios in accordance with the particular profile by discretely and/or continuously forming a number of sub-layers having desired relative compositions. The effects of parameter adjustments depend on the materials employed for M1 and M2. For a compound wherein M1 is Hf and M2 is Si, increases in temperature, pressure, and/or the second precursor flow rate increase the relative amount of Si in the dielectric compound.

FIG. 9 is a flow diagram illustrating a method 900 of forming a semiconductor device. The method 900 employs a chemical vapor deposition process that forms a dielectric layer having a particular profile for a relative composition ratio.

The method 900 begins at block 902 wherein a substrate is provided, wherein the substrate can be un-doped, lightly doped p-type, or lightly doped n-type and is comprised of a semiconductor material such as silicon. A well of p-type or n-type conductivity can be formed within the substrate. A dielectric layer is formed at block 904 in a series of discrete and/or continuous steps so as to form the dielectric layer having a particular profile and desired dielectric properties. The dielectric layer formed is comprised of a high-k dielectric material, which is a composite of a number of sub-layers. Each sub-layer is formed in discrete or continuous steps such that each sub-layer has a desired relative composition ratio. The sub-layers, and therefore the dielectric layer, are comprised of a dielectric compound represented by the formula, $M1_xM2_{1-x}O_zN_w$, where M1 and M2 are chosen from the list of elements comprising Hf, Zr, La, Gd, Pr, Ce, Si, Al, Y, and the like. The O and N component ratios can be adjusted as desired for a given implementation.

A gate electrode is formed on the dielectric layer at block 906. The gate electrode is comprised of a conductive material such as polysilicon, metal, silicon-germanium or the like. Then, the gate and the dielectric layer are patterned at block 908 to form a gate stack, which comprises the dielectric layer and the gate. Finally, a source region and a drain region are formed within the substrate at block 910. A channel region is defined within the substrate lying between the source region and the drain region.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor device comprising:
   forming a plurality of dielectric sub-layers using chemical vapor deposition, said plurality of dielectic sub-layers having respective relative composition ratios on a substrate, wherein the plurality of dielectric sub-layers define a dielectric layer having a particular relative composition profile and wherein the particular relative compostion profile is substantially constant;
   forming a gate electrode on the dielectric layer;
   patterning the gate electrode and the dielectric layer therein defining a gate stack; and
   forming a source region and a drain region within the substrate.

2. The method of claim 1, wherein the substrate is comprised at least partly of silicon and wherein the dielectric layer is at least partly comprised of silicon, wherein forming the plurality of dielectric sub-layers further comprises forming a lower interface dielectric sub-layer on the substrate that has a relatively high ratio of silicon and that facilitates bonding to the substrate.

3. The method of claim 1, wherein forming the plurality of dielectric sub-layers further comprises forming an upper interface dielectric sub-layer that has a relatively high ratio of silicon, wherein the gate is comprised of polysilicon or silicon-germanium and wherein forming the gate further comprises forming a bond with the upper interface dielectric sub-layer.

4. The method of claim 1, wherein forming the plurality of dielectric sub-layers further comprises forming an upper interface dielectric sub-layer that has a relatively high ratio of a metal material, wherein the gate is comprised of the metal material and wherein forming the gate further comprises forming a bond with the upper interface dielectric sub-layer.

5. The method of claim 1, wherein the particular relative composition profile varies by less than about one percent.

* * * * *